(12) United States Patent
Dinariev et al.

(10) Patent No.: US 10,718,188 B2
(45) Date of Patent: Jul. 21, 2020

(54) METHOD FOR EVALUATION OF FLUID TRANSPORT PROPERTIES IN HETEROGENOUS GEOLOGICAL FORMATION

(71) Applicant: Schlumberger Technology Corporation, Sugar Land, TX (US)

(72) Inventors: Oleg Yurievich Dinariev, Moscow (RU); Nikolay Vyacheslavovich Evseev, Moscow (RU); Sergey Sergeevich Safonov, Cambridge (GB); Denis Vladimirovich Klemin, Houston, TX (US)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 350 days.

(21) Appl. No.: 15/749,791

(22) PCT Filed: Aug. 4, 2016

(86) PCT No.: PCT/US2016/045497
§ 371 (c)(1),
(2) Date: Feb. 2, 2018

(87) PCT Pub. No.: WO2017/024113
PCT Pub. Date: Feb. 9, 2017

(65) Prior Publication Data
US 2018/0223633 A1    Aug. 9, 2018

Related U.S. Application Data

(60) Provisional application No. 62/201,884, filed on Aug. 6, 2015, provisional application No. 62/202,387, filed on Aug. 7, 2015.

(51) Int. Cl.
*G06G 7/48* (2006.01)
*E21B 41/00* (2006.01)
(Continued)

(52) U.S. Cl.
CPC .......... *E21B 41/0092* (2013.01); *E21B 41/00* (2013.01); *E21B 49/088* (2013.01);
(Continued)

(58) Field of Classification Search
CPC ...... G06F 30/20; E21B 41/00; E21B 41/0092; E21B 49/00
(Continued)

(56) References Cited

U.S. PATENT DOCUMENTS 7,047,165 B2   5/2006   Balaven et al.
7,526,418 B2   4/2009   Pita et al.
(Continued)

OTHER PUBLICATIONS

D.Tiab, E.D.Donaldson. Petrophysics. Theory and Practice of Measuring Reservoir Rock and Fluid Transport Properties. Elsevier, 2004, pp. 147-152.
(Continued)

*Primary Examiner* — Andre Pierre Louis
(74) *Attorney, Agent, or Firm* — Cameron R. Sneddon

(57) ABSTRACT

A set of reservoir production results are obtained by simulation of hydrocarbons flow in a heterogeneous reservoir based on the values of heterogeneity blocks transport matrices. The transport matrices of the heterogeneity blocks are calculated from a reservoir block hierarchy. The simulation is initiated by a set of foundation blocks transport matrices calculated by evaluating a fluid transport law in the blocks being in the lowest rank of the hierarchy.

16 Claims, 10 Drawing Sheets

(51) Int. Cl.
  *G06F 30/20* (2020.01)
  *E21B 49/08* (2006.01)
  *G01V 1/40* (2006.01)

(52) U.S. Cl.
  CPC ............. *G06F 30/20* (2020.01); *G01V 1/40* (2013.01); *G01V 2210/6122* (2013.01)

(58) Field of Classification Search
  USPC ..................................................... 703/9, 10
  See application file for complete search history.

(56) References Cited

U.S. PATENT DOCUMENTS

| | | | |
|---|---|---|---|
| 7,634,395 B2 | 12/2009 | Flandrin et al. | |
| 2003/0201098 A1* | 10/2003 | Karanikas | B09C 1/02 166/53 |
| 2010/0254217 A1 | 10/2010 | Chu et al. | |
| 2011/0166843 A1* | 7/2011 | Hsu | G06F 30/23 703/10 |
| 2013/0096900 A1* | 4/2013 | Usadi | G06F 30/20 703/10 |
| 2013/0311158 A1* | 11/2013 | Dasari | G01V 99/005 703/10 |

OTHER PUBLICATIONS

E.J.Peters. Petrophysics, https://www.scribd.com/document/46981764/Peters-E-J-Petrophysics, University of Texas, 2007, p. 3-107.
E.J.Peters, Petrophysics. https://www.scribd.com/document/46981764/Peters-E-J-Petrophysics, University of Texas, 2007, pp. 5-23,5-24.
A. Demianov, O. Dinariev and N. Evseev, Density functional modelling in multiphase compositional hydrodynamics, Can. J. Chem. Eng., 89, pp. 206-226, 2011.
A. Demianov, O. Dinariev and N. Evseev. Introduction to the Density Functional Method in Hydrodynamics. FIZMATLIT, 2014, (7 pages).
Lyons, Standard Handbook of Petroleum & Natural Gas Engineering, Elsevier, 2005, p. 5-159.
T.Ahmed, Reservoir Engineering Handbook, Elsevier, 2006, p. 735.
O.Dinariev, D.Mikhailov. Basics of mesoscale theory for porous materials, NEDRA, 2012, pp. 44-84.
International Search Report and Written Opinion issued in the related PCT Application PCT/US2016/045497 dated Oct. 28, 2016 (7 pages).
International Preliminary Report on Patentability issued in the related PCT Application PCT/US2016/045497 dated Feb. 6, 2018 (5 pages).

* cited by examiner

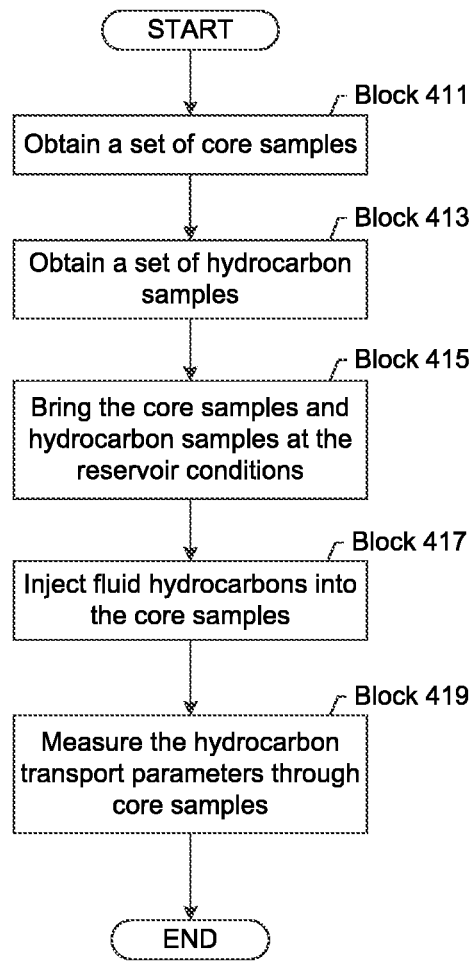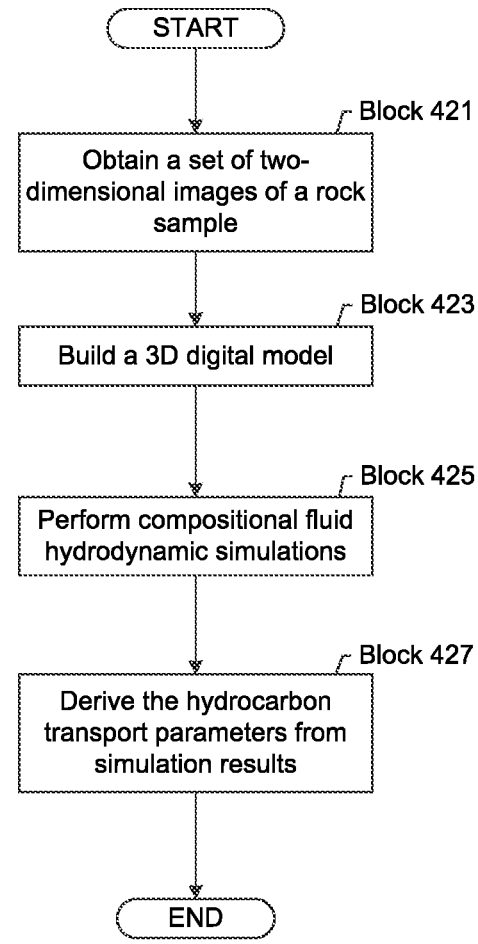
FIG. 4.1    FIG. 4.2

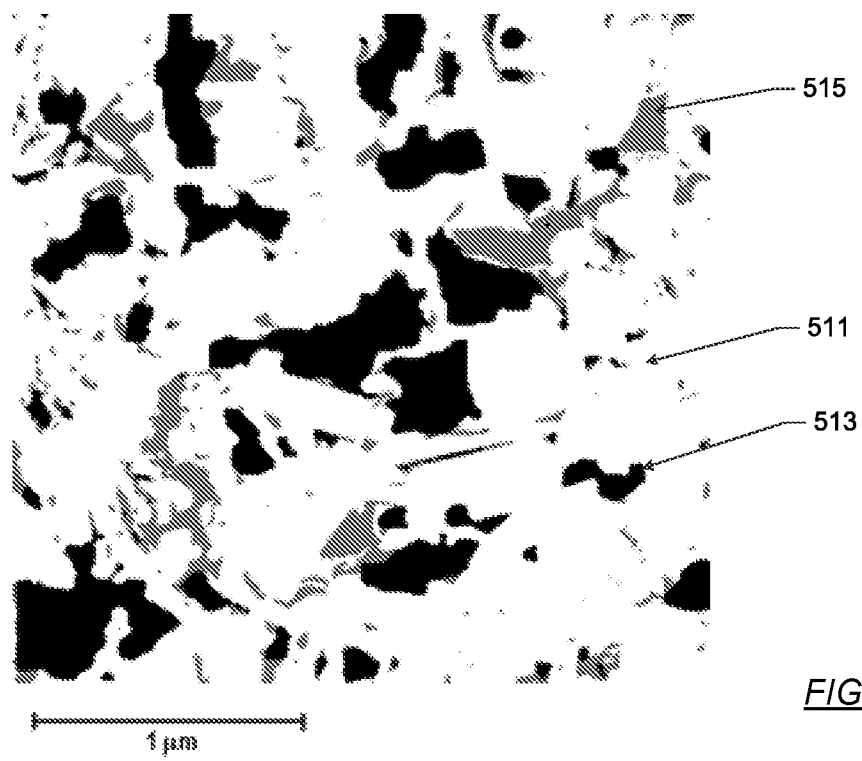
FIG. 5.1
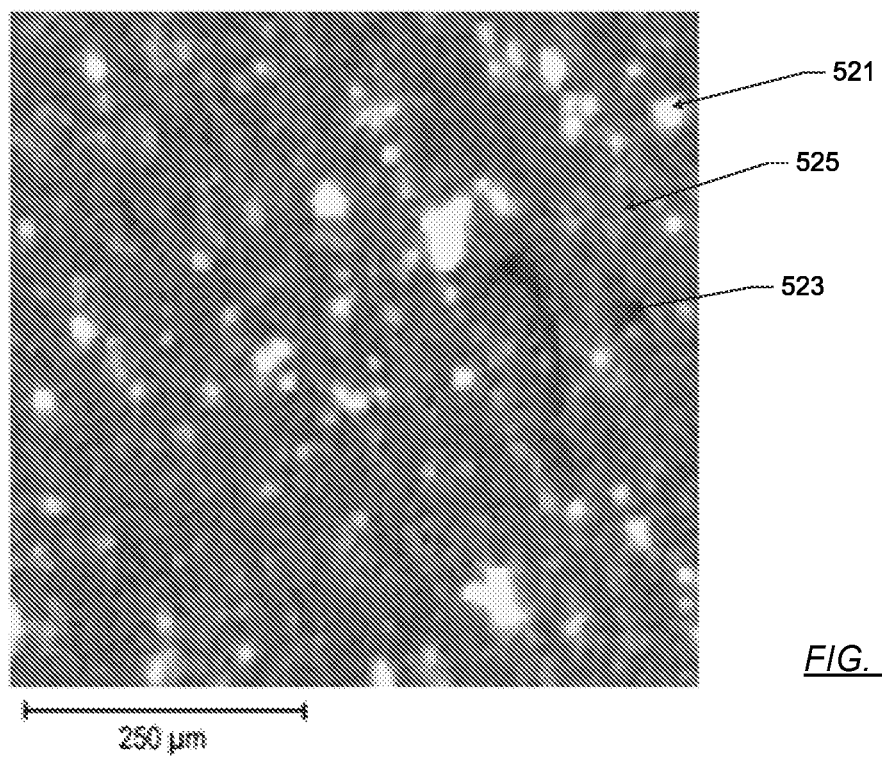
FIG. 5.2

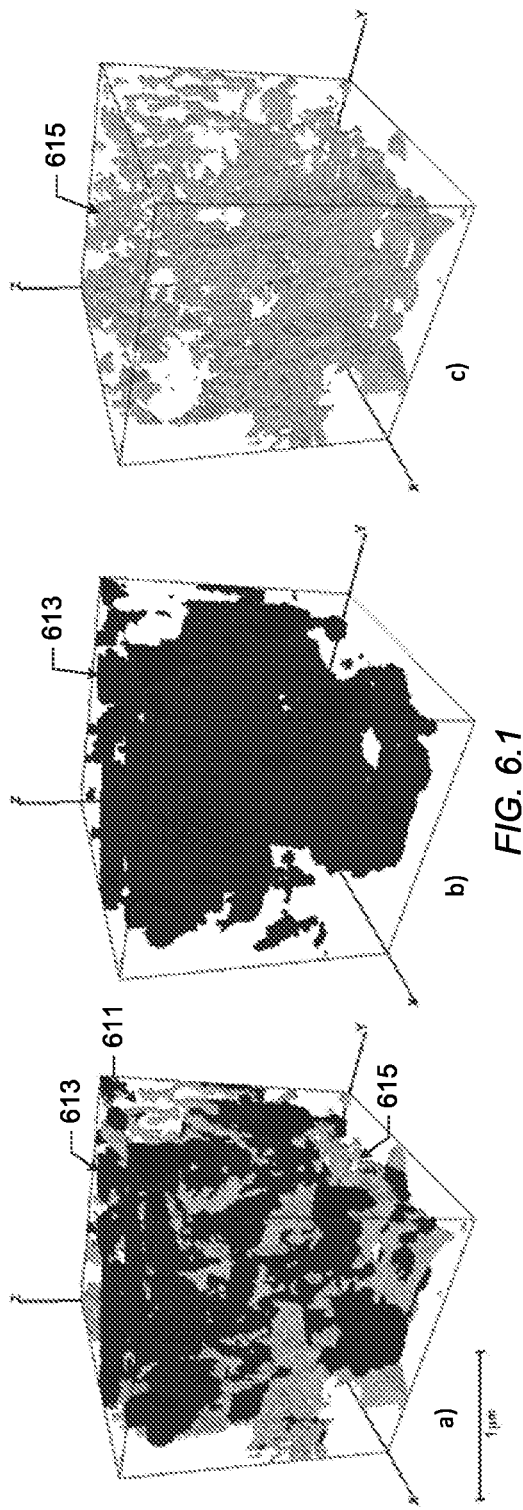
FIG. 6.1
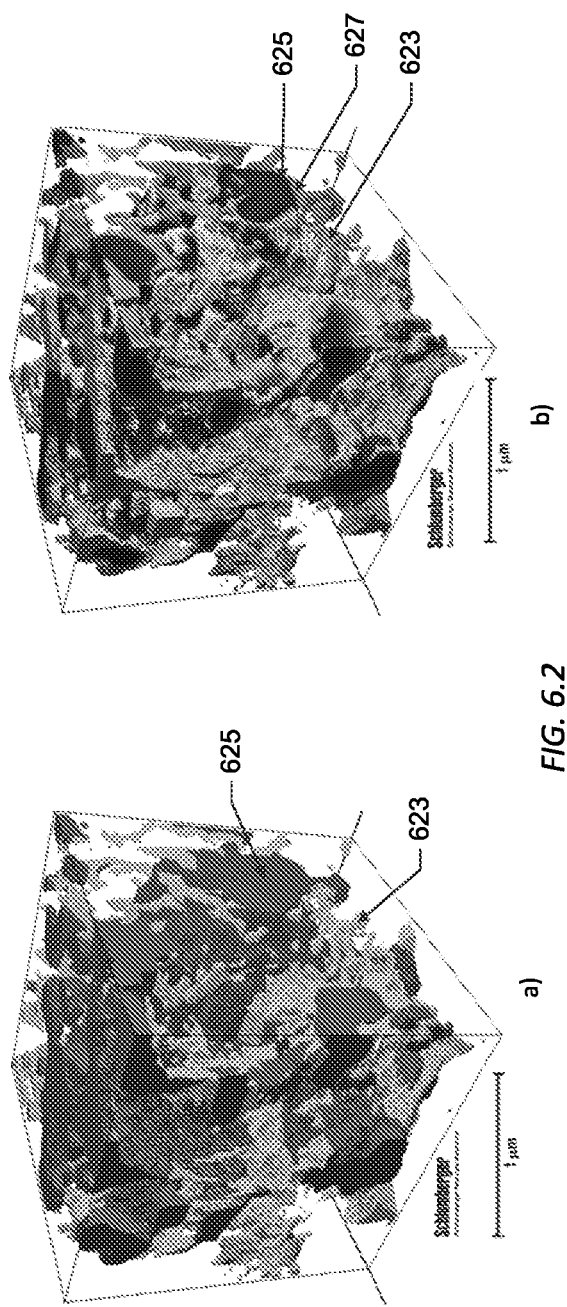
FIG. 6.2

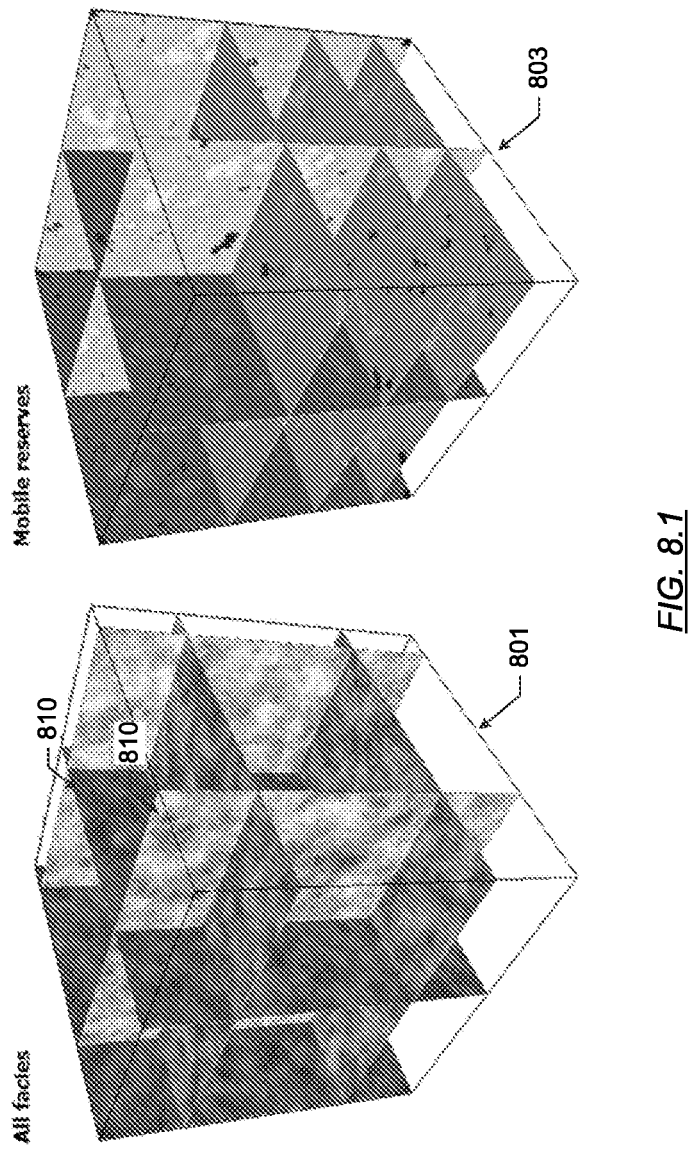
FIG. 8.1

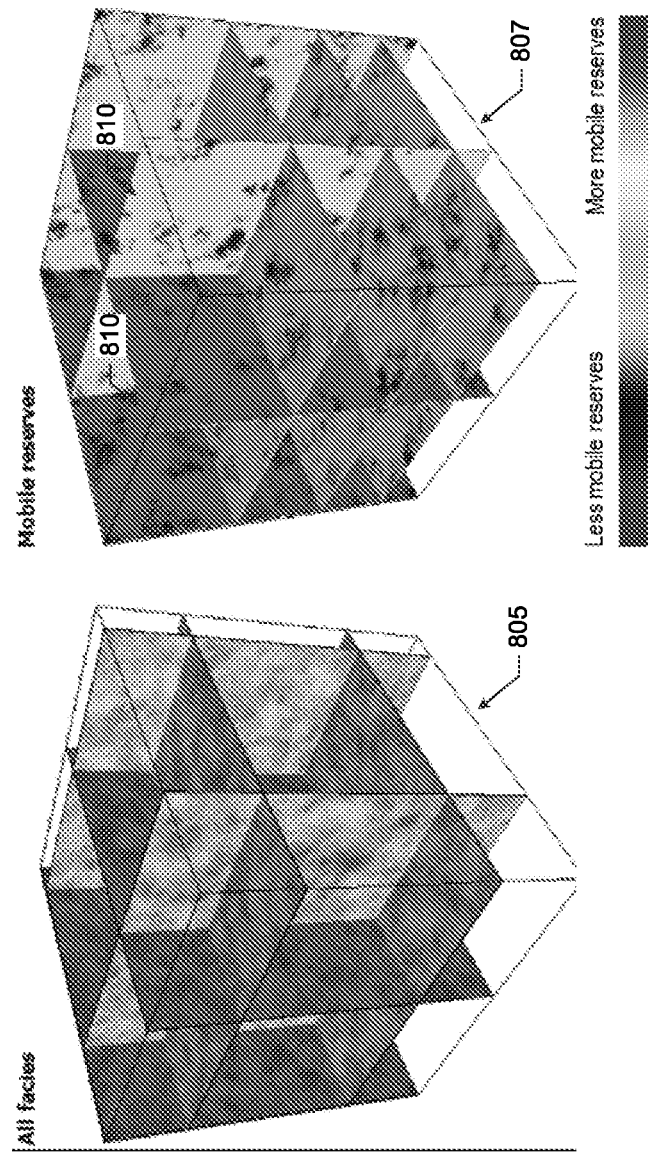
FIG. 8.2

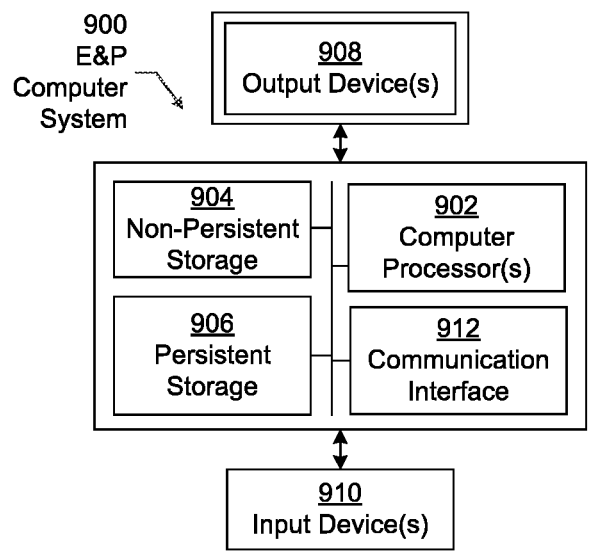
FIG. 9.1
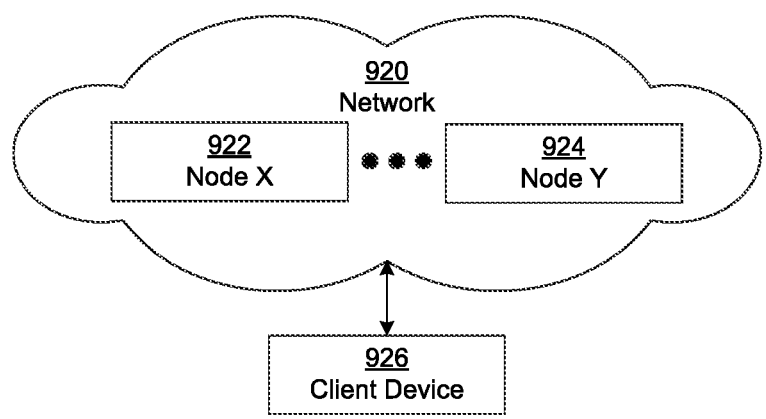
FIG. 9.2

METHOD FOR EVALUATION OF FLUID TRANSPORT PROPERTIES IN HETEROGENOUS GEOLOGICAL FORMATION

CROSS-REFERENCE TO RELATED APPLICATIONS

This application claims priority under 35 U.S.C. § 119(e) to U.S. Provisional Patent Application Ser. No. 62/201,884, filed on Aug. 6, 2015, and entitled "METHOD FOR EVALUATION OF FLUID TRANSPORT PROPERTIES IN HETEROGENEOUS GEOLOGICAL FORMATION," and Provisional Patent Application Ser. No. 62/202,387, filed on Aug. 7, 2015, and entitled "METHOD FOR THE EVALUATION OF OIL AND GAS RECOVERY FOR TIGHT RESERVOIRS SATURATED BY VOLATILE OIL," which are incorporated herein by reference in their entirety.

BACKGROUND

Extracting fluid hydrocarbons from the subsurface involves understanding and ability to predict the fluid's movement through the subsurface rocks for both technical and economic reasons. In order to predict the fluid's movement, numeric simulations of multi-phase and multi-component fluid flow through hydrocarbon reservoirs are performed on geologic models that describe the properties of the hydrocarbon reservoirs. However, because the subsurface rocks are heterogeneous in terms of rock properties, the geologic and pore scale rock models include many grid cells for the models to accurately predict the fluid hydrocarbon flow and accumulation.

SUMMARY

In general, embodiments are directed to evaluating the fluid transport properties for oil and gas reservoirs when the geological formation in the reservoir is heterogeneous with several different scales of heterogeneity. A reservoir is divided into a hierarchy containing superior heterogeneity blocks and inferior heterogeneity blocks. The heterogeneity blocks are characterized by a transport matrix that defines a hydraulic transport property of the heterogeneity blocks. A set of values for the transport matrices of the heterogeneity blocks are calculated, based on the hierarchy. A set of values for the transport matrix of the blocks being in the lowest rank of the hierarchy are calculated by evaluating a fluid transport law. The reservoir production results are obtained by simulation of hydrocarbons flow in the heterogeneous reservoir based on the values of the transport matrices.

Other aspects of the technology will be apparent from the following description and the appended claims.

BRIEF DESCRIPTION OF DRAWINGS

FIGS. 3, 4.1, and 4.2 show flowcharts in accordance with one or more embodiments.

FIGS. 5.1, 5.2, 6.1, 6.2, 7, 8.1 and 8.2 show examples in accordance with one or more embodiments.

FIG. 9.1 shows computing system in accordance with one or more embodiments.

FIG. 9.2 shows a network system in accordance with one or more embodiments.

DETAILED DESCRIPTION

Figure 1:
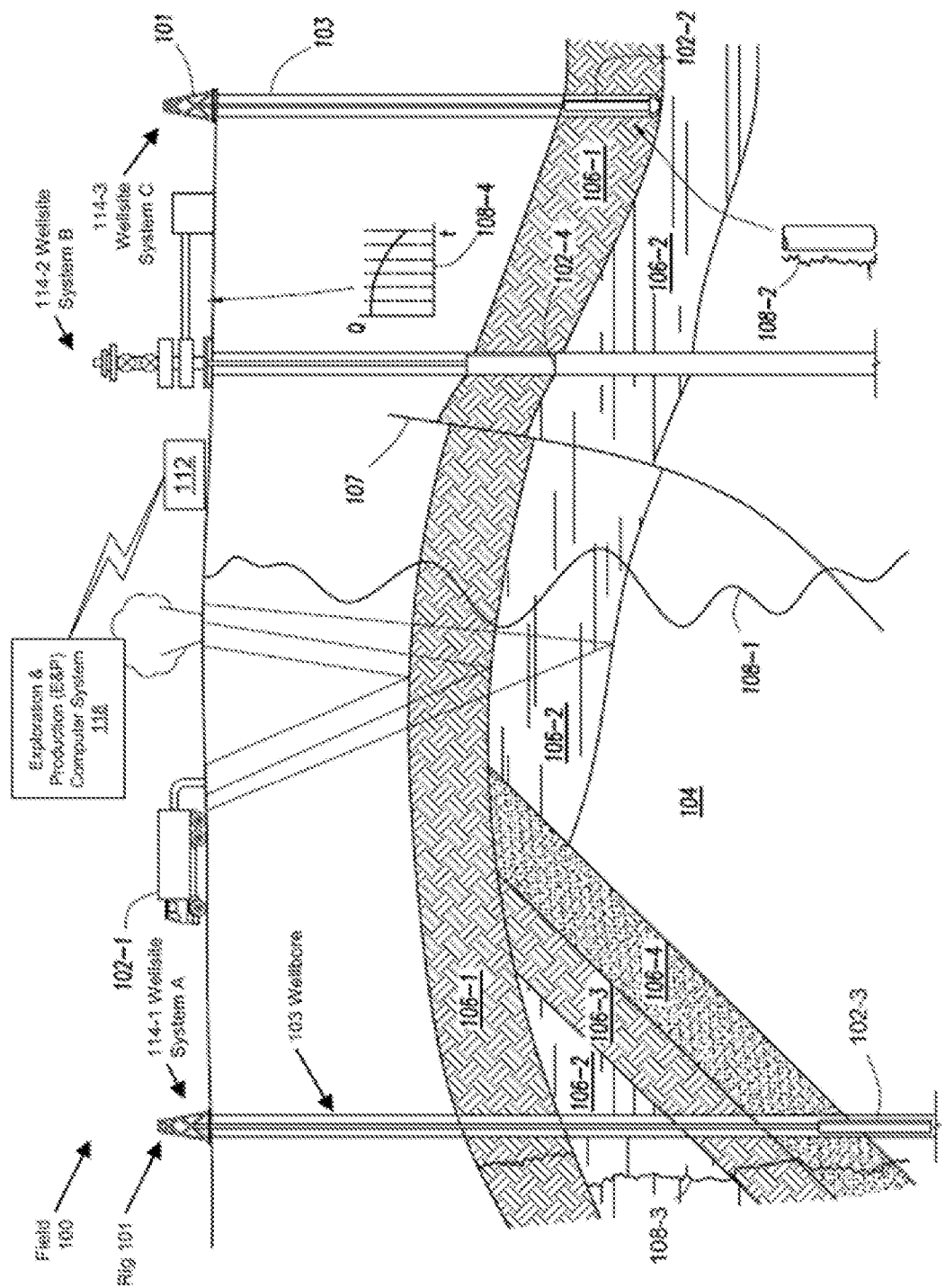
FIG. 1 is a schematic view, partially in cross-section, of a field in which one or more embodiments of evaluation of fluid transport properties in heterogeneous geological formation may be implemented.

Specific embodiments will now be described in detail with reference to the accompanying figures. Like elements in the various figures are denoted by like reference numerals for consistency.

In the following detailed description of embodiments, numerous specific details are set forth in order to provide a more thorough understanding. However, it will be apparent to one of ordinary skill in the art that embodiments may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

One or more embodiments may be applied to reservoir simulation to manage a physical reservoir. In one or more embodiments, the oil and gas reservoir may be a tight reservoir. For example, the tight reservoir may be a shale formation that has oil and gas. The tight reservoirs may be difficult to develop as the reservoir formation exhibits very low permeability (e.g., microDarcy or nanoDarcy orders of magnitude) that reduces the flow of hydrocarbon fluids toward the production wells. In one or more embodiments, the tight reservoirs have highly heterogeneous rock properties at any scale starting from microns up to millimeters and meters. The large variation of rock properties at multiple scales complicates the applicability of traditional understanding of hydrocarbon storage and transport in pores. In general, embodiments of the technology provide a method and system for evaluation of fluid transport properties for oil and gas reservoirs when the geological formation in the reservoir is heterogeneous with several different scales of heterogeneity.

Reservoir simulation involves the construction of a computer model to represent a portion of a field (e.g., a reservoir) for the purposes of making decisions regarding the development of the field. The computer model represents the physical space of the reservoir by an array of discrete grid blocks, delineated by a grid which may be regular or irregular. Each block in the grid represents a subsurface volume. The array of grid blocks may be two-dimensional (2D), three-dimensional (3D), etc. Values for physical attributes, such as porosity, permeability and liquid or vapor hydrocarbon saturation, may be associated with each grid block. The value of each attribute may vary across the reservoir volume, but the value is applied uniformly throughout the volume of the grid block. As an example, simulations may solve a complex set of non-linear partial differential equations that model the fluid flow in porous media over a sequence of simulation time points. Grid resolution may impact the accuracy of simulation results, such as in a highly heterogeneous reservoir. However, for practical applications, upscaling techniques may be used to capture fine scale phenomena while using relatively coarse grids. In one or more embodiments, an upscaling technique is used for simulation of fluid hydrocarbons flow through a heterogeneous reservoir to estimate the volumes of fluid hydrocarbons that may be recoverable. In one or more embodiments, the upscaling process may be initiated by the results of a set of pore scale models simulations, whereby the pore scale models used in the simulations represent the pore geometry of the reservoir rock.

FIG. 1 depicts a schematic view, partially in cross section, of a field (100) in which one or more embodiments may be implemented. In one or more embodiments, one or more of the modules and elements shown in FIG. 1 may be omitted, repeated, and/or substituted. Accordingly, embodiments should not be considered limited to the specific arrangements of modules shown in FIG. 1.

A geologic sedimentary basin contains subterranean formations (104). As shown in FIG. 1, the subterranean formation (104) may include several geological structures (106-1 through 106-4). As shown, the formation may include a shale layer (106-1), a limestone layer (106-2), a sandstone layer (106-3), and another shale layer (106-4). A fault plane (107) may extend through the formation. In particular, the geologic sedimentary basin includes rock formations and at least one reservoir including fluids. In one or more embodiments, the rock formations include at least one seal rock, for example, the shale layer (106-1), which may act as a top seal. In one or more embodiments, the rock formations may include at least one seal rock, for example, the shale layer (106-4), which may act as a bottom seal. In one or more embodiments, various survey tools and/or data acquisition tools are adapted to measure the formation and detect the characteristics of the geological structures of the formation. Generally, survey operations and wellbore operations are referred to as field operations of the field (100). These field operations may be performed as directed by the surface unit (112).

In one or more embodiments, the surface unit (112) is communicatively coupled to the exploration and production (E&P) computer system (118). The E&P computer system may be the computer system described in FIGS. 9.1 and 9.2. In one or more embodiments, the data received by the surface unit (112) may be sent to the E&P computer system (118) for further analysis. Generally, the E&P computer system (118) is configured to analyze, model, control, optimize, or perform management tasks of the aforementioned field operations based on the data provided from the surface unit (112). In one or more embodiments, the E&P computer system (118) is provided with functionality for manipulating and analyzing the data, such as performing simulation, planning, and optimization of production operations of the wellsite system A (114-1), wellsite system B (114-2), and/or wellsite system C (114-3). In one or more embodiments, the result generated by the E&P computer system (118) may be displayed for an analyst user to view the result in a 2D display, 3D display, or other suitable displays. Although the surface unit (112) is shown as separate from the E&P computer system (118) in FIG. 1, in other examples, the surface unit (112) and the E&P computer system (118) may also be combined.

Although FIG. 1 shows a field (100) on the land, the field (100) may be an offshore field. In such a scenario, the subterranean formation may be in the sea floor. Further, field data may be gathered from the field (100) that is an offshore field using a variety of offshore techniques for gathering field data.

In one or more embodiments, the data received by the surface unit (112) represents characteristics of the subterranean formation (104) and may include seismic data and/or information related to location of the horizon and fault surfaces or characteristics of the formation rocks like porosity, saturation, permeability, natural fractures, stress magnitude and orientations, elastic properties, etc., during a drilling, fracturing, logging, or production operation of the wellbore (103) at the wellsite system (110).

Figure 2:
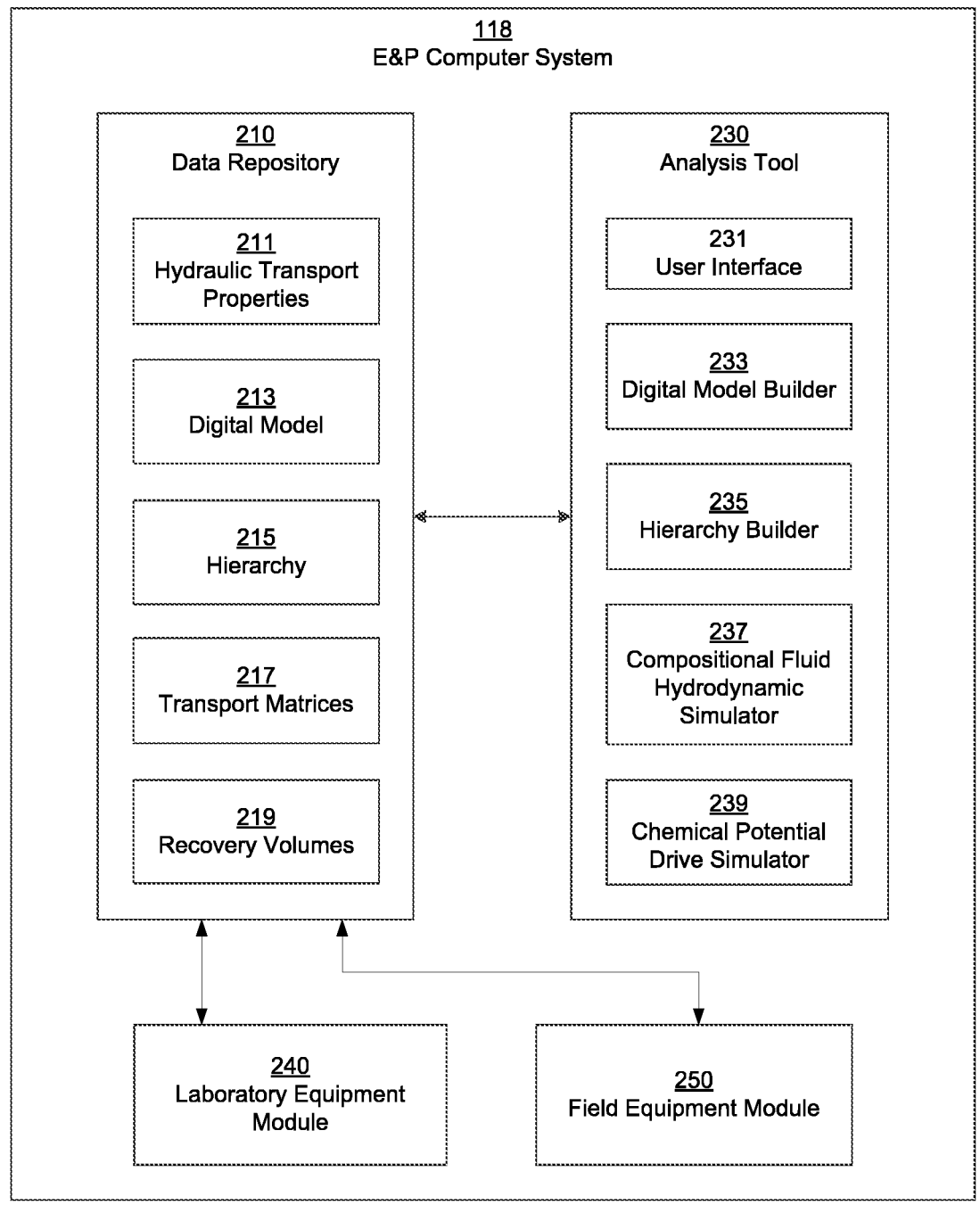
FIG. 2 shows a diagram of a system in accordance with one or more embodiments.

FIG. 2 shows more details of the E&P computer system (118) in which one or more embodiments of the technology may be implemented. In one or more embodiments, one or more of the modules and elements shown in FIG. 2 may be omitted, repeated, and/or substituted. Accordingly, embodiments of evaluation of fluid transport properties in heterogeneous geological formation should not be considered limited to the specific arrangements of modules shown in FIG. 2.

As shown in FIG. 2, the E&P computer system (118) includes a data repository (211) for storing input data, intermediate data, and resultant outputs of the analysis data, an analysis tool (230), a laboratory equipment module (240), and a field equipment module (250) for performing various tasks of the field operation. In one or more embodiments, the data repository (210) may include one or more disk drive storage devices, one or more semiconductor storage devices, other suitable computer data storage devices, or combinations thereof. In one or more embodiments, content stored in the data repository (210) may be stored as a data file, a linked list, a data sequence, a database, a graphical representation, any other suitable data structure, or combinations thereof.

In one or more embodiments, the content stored in the data repository (200) includes hydraulic transport properties (211), digital model (213), a hierarchy (215), transport matrices (217), and recovery volumes (219). Each of these components is discussed below.

In one or more embodiments, the hydraulic transport properties (211) describe the physical properties of fluids and rocks of the subsurface formation. In one or more embodiments, the hydraulic transport properties (211) control the flow velocity of hydrocarbon components and phases through the rocks of the subsurface formations. For example, the fluid properties may include density, viscosity, temperature, pressure, chemical composition, and other properties of one or more fluids. Further, the rock properties may include density, porosity, permeability, capillary entry pressure and other properties of one or more rocks. In one or more embodiments, the rocks may be naturally or artificially fractured. The fractures may be characterized in this embodiment by the fault properties (e.g., capillary pressure, shale gauge ratio, etc.) associated with the subsurface formations.

The digital model (213) is 3D rendering of a portion of the subsurface reservoir. In one or more embodiments, the digital model (213) contains information regarding the spatial distribution of rock grains, pores and solid organics within the portion of the subsurface reservoir. In one or more embodiments, the digital model (213) is obtained from laboratory measurements.

In one or more embodiments, the subsurface reservoir can be represented in a computer model as a set of heterogeneity blocks, each heterogeneity block corresponding to a subsurface volume of the reservoir. In other words, each heterogeneity block represents a subsurface volume of the reservoir. In one or more embodiments, the heterogeneity blocks are nested and ranked according to a hierarchy (215). In one or more embodiments, the hierarchy (215) is defined as an organization in which the heterogeneity blocks are ranked one above the other according to a set of rules. In one or more embodiments, a hierarchy is set based on containment. For example, a heterogeneity block is a superior heterogeneity block of an inferior heterogeneity block based on containment of the inferior heterogeneity block (i.e., inferior block) by the superior heterogeneity block (i.e., superior block). The immediate superior and the immediate inferior means that the block is directly connected in the hierarchy (e.g., next size up or size down is the immediate superior and the immediate inferior). Whether to divide a block into inferior blocks, the size and/or dimensions of the inferior blocks and the partitioning of the superior block may be based on one or more rules. For example, a threshold value for the variation of a property of the reservoir rock may be used to define the limits of a set superior heterogeneity blocks, while a smaller scale variation of the property may be used to define the limits of a subset of inferior heterogeneity blocks. In one or more embodiments, the heterogeneity blocks ranked at the base of the hierarchy are defined as foundation blocks. In one or more embodiments, the division of the superior block into inferior blocks is non-uniform. In other words, the immediate inferior blocks of the same superior block may be in non-uniform shape and/or sizes. Further, in one or more embodiments, the division is a partitioning whereby the immediate inferior blocks span the superior block and are non-overlapping with respect to each other. In one or more embodiments, each heterogeneity block has assigned a set of hydraulic properties (211) represented as a transport matrix (217).

The transport matrices (217) are numeric structures that represent the coefficients of the linear function that defines fluid transport through heterogeneity blocks. In one or more embodiments, a transport matrix characterizes the flux of the hydrocarbon components, with respect to chemical potential gradient, in each fluid phase within a heterogeneity block. In one or more embodiments, the chemical potential defines the free energy level of the hydrocarbon components while the hydrocarbon components transport occurs along the direction of the component concentration variation within a system, the concentration variation driving a particle along a gradient from higher to lower chemical potential.

The recovery volumes (219) represent the quantity of the fluid hydrocarbons that is available for extraction based on the reservoir simulation results. In one or more embodiments, the hydrocarbon components are present in a subsurface formation as a solid component affixed to the rock matrix or as fluid component within the liquid or vapor phases. In one or more embodiments, part of the fluid hydrocarbon components are bound to the pore space as a result of strong capillarity forces. In one or more embodiments, the mobile components of fluid hydrocarbons are considered in recovery volumes (219) estimation.

Continuing with FIG. 2, the E&P computer system (118) additionally includes an analysis tool (230) in accordance with one or more embodiments. The analysis tool (230) includes a user interface (231), a digital model builder (233), a hierarchy builder (235), a compositional fluid hydrodynamic simulator (237), and a chemical potential drive simulator (239). Each of these components is described below.

In one or more embodiments, the user interface (231) corresponds to a graphical user interface (GUI) that includes functionality to receive input from a user and present or display graphical data to the user. The user interface (231) includes a 3D subsurface reservoir viewer, a 2D section of subsurface reservoir profile viewer, and parameters of value input fields in accordance with one or more embodiments. The input fields include functionality to receive input parameters from a user. For example, the input parameters may include a set of boundary conditions for the reservoir simulation, an observation point angle defining a rendering of the 3D subsurface reservoir, a location to display a 2D section of subsurface reservoir, a color palette to map different reservoir rock properties, different fluid properties, or any other parameter for simulating the reservoir. In one or more embodiments, the input fields may include selection boxes, text fields, drop-down menus, or any other type of field for a user to input data.

Although the user interface (211) is described with respect to the subsurface reservoir, the user interface (211) may include additional user interface components for oilfield analysis. For example, the user interface (211) may include components for simulation and modeling operations, components for interacting with the oilfield, including sending commands to the oilfield, and other components that are not shown or expressly described above.

The digital model builder (233) is a software component that is configured to generate a digital model (213) by rendering a set of laboratory measurement data. In one or more embodiments, the digital model builder (233) employs a high resolution technology (for example, focus ion beam scanning electron microscope (FIB-SEM), two-dimensional scanning electron microscope (SEM 2D) and others) to scan a subsurface formation sample and reproduce the spatial distribution of rock grains, pores and solid organics within the formation sample. In one or more embodiments, the digital model builder (233) uses a lower resolution technology (for example, X-ray micro-tomography, computerized tomography (CT) scanning, and others) to scan the formation sample and obtain the heterogeneity information at the larger scale.

The hierarchy builder (235), is a software component that is configured to divide the reservoir volume in a sequence of heterogeneity blocks and rank the heterogeneity blocks according to each heterogeneity block role within the hierarchy (215). In one or more embodiments, the hierarchy builder (235) is configured to calculate, for each of the heterogeneity blocks in the subsurface reservoir, a value for the heterogeneity block transport matrix based on the heterogeneity blocks immediately inferior according to the hierarchy. In one or more embodiments, the value for the foundation blocks transport matrix is based on either experimental or computational evaluations of fluid hydrocarbon transport through the foundation blocks.

The compositional fluid hydrodynamic simulator (237), is a software component that is configured to simulate fluid transport through the reservoir rocks using fluid transport laws based on conservation of chemical components, momentum and energy equations with applied boundary conditions. In one or more embodiments, the compositional fluid hydrodynamic simulator (237) is configured to perform simulations on a set of digital models (213) to evaluate the digital models storage capacity and fluid transport properties. In one or more embodiments, a digital model is produced for each of the foundation block and simulation is performed on the foundation blocks to determine the foundation blocks' transport matrix values.

The chemical potential drive simulator (239) is a software component that is configured to simulate fluid transport through the reservoir rocks using chemical potential drive fluid transport laws. In one or more embodiments, the chemical potential drive simulator (239) is configured to evaluate the recovery volumes of the reservoir by describing the transport of fluid hydrocarbon components in terms of chemical component fluxes having chemical potential gradients as driving forces.

In one or more embodiments, the E&P computer system (118) includes the laboratory equipment module (240) that is configured to interface with one or more laboratory instruments and acquire data according to a predefined protocol. In one or more embodiments, the data acquisition sequence may be initiated as a result of a manual input signal from a user. In one or more embodiments, the laboratory equipment module (240) is configured to acquire information regarding the structure of rock grains, pores and solid organics within a formation sample in order to generate the digital model (213). For example, the laboratory equipment module (240) may interface with instruments like a X-ray micro-tomograph, a nuclear magnetic resonance (NMR) imager, a thin-section petrographic microscope, a scanning electron microscope (SEM), a 3D focus ion beam scanning electron microscope (FIB-SEM), and the module may also include an energy-dispersive X-ray spectrometer (EDX), etc. In one or more embodiments, the laboratory equipment module (240) is configured to acquire information from laboratory core samples test instruments.

In one or more embodiments, the E&P computer system (118) includes the field equipment module (250) that is configured to generate a field operation control signal based at least on a result generated by the E&P computer system (118), such as based on the likelihood of unreliable subsurface information due to a bull-eyes effect in some regions of the field (100) depicted in FIG. 1 above. As noted above, the field operation equipment depicted in FIG. 1 may be controlled by the field operation control signal. For example, the field operation control signal may be used to control drilling equipment, an actuator, a fluid valve, or other electrical and/or mechanical devices disposed about the field (100). In one or more embodiments, field equipment module (250) is configured to acquire a set of data from the field regarding one or more properties of the subsurface formations.

Figure 3:
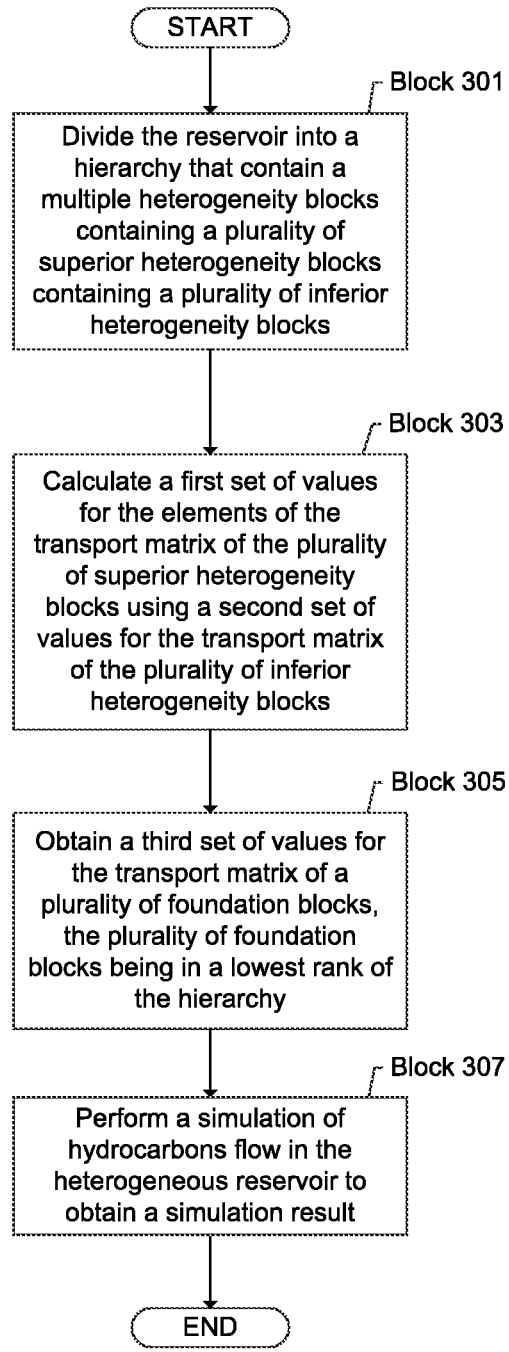

FIG. 3 depicts a flowchart of an example method in accordance with one or more embodiments. For example, the method depicted in FIG. 3 may be practiced using the E&P computer system (118) described in reference to FIGS. 1 and 2 above. In one or more embodiments, one or more of the elements shown in FIG. 3 may be omitted, repeated, and/or performed in a different order. Accordingly, one or more embodiments should not be considered limited to the specific arrangements of elements shown in FIG. 3.

In Block 301, the reservoir is divided into a hierarchy that contains multiple heterogeneity blocks. In one or more embodiments, the heterogeneity blocks containing one or more superior heterogeneity blocks containing one or more inferior heterogeneity blocks, each heterogeneity blocks being characterized by a transport matrix that defines a hydraulic transport property of the heterogeneity block. In one or more embodiments, the reservoir is represented as a statistical ensemble of interconnected heterogeneity blocks with a hierarchical transport mechanism. In one or more embodiments, the model containing the heterogeneity blocks is characterized by mesoscale (>1 m) transport mechanism of hydrocarbons through the subsurface formations. In one or more embodiments, the heterogeneity blocks are representative of the subsurface reservoir formation in respect to rock properties (for example pore geometry, mineralogy, wettability, etc.) with account of variability range.

In Block 303, based on the hierarchy, a first set of values is calculated for the elements of the transport matrix of the superior heterogeneity blocks using a second set of values for the transport matrix of the inferior heterogeneity blocks.

In Block 305, a fluid transport law is evaluated and a third set of values is obtained for the transport matrix of the foundation blocks. In one or more embodiments, a nanoscale (<1 nm) transport mechanism may be used to simulate the hydrocarbons transport through the foundation blocks. In one or more embodiments, the fluid transport law is evaluated based on an experimental method.

In Block 307, a simulation result is obtained by performing a simulation of hydrocarbons flow in the reservoir based on the first set of values, the second set of values, and the third set of values. In one or more embodiments, the mesoscale transport mechanism is used to simulate the hydrocarbons transport through the reservoir by applying the mesoscale transport mechanism in each superior heterogeneity block. In one or more embodiments, a connectivity relationship defined within the hierarchy is used to integrate the fluid transport through the heterogeneity blocks. In one or more embodiments, the fluid transport law through the reservoir may be described as:

$$Q_{ia} = -\sum_{b=1}^{3}\sum_{j=1}^{M} \Lambda_{ab}^{ij} \partial_b \kappa_j \qquad \text{EQ. 1}$$

where $Q_{ia}$ is molar flux of i-th chemical component in the mixture, $\kappa_j$ is the local value of the chemical potential of the j-th component in the mixture, $\Lambda_{ab}^{ij}$ is the chemical potential drive (CPD) transport matrix, which characterizes the considered heterogeneity block. In one or more embodiments, the CPD transport matrix can be degenerated in order to take into account osmotic phenomena. In one or more embodiments, the chemical potential may contain gravitational or/and electrostatic parameters to cover for gravitational segregation and electrokinetic effects. In one or more embodiments, the transport law described in EQ. 1 incorporates advective and diffusive fluid flow components. In other words, the mathematical expression presented in EQ. 1 incorporates transport phenomena for different reservoir rock types. In one or more embodiments, the transport matrix for a superior heterogeneity block is calculated based on a number of inferior heterogeneity blocks, the inferior heterogeneity blocks having rock properties representing the variability of the properties within the considered superior heterogeneity block.

In one or more embodiments, the dynamics of oil and gas recovery from the entirety of the reservoir is evaluated using the integration over the dynamical processes in a statistical ensemble, wherein the statistical ensemble is represented by the heterogeneity blocks contained in the reservoir, considered at once. In particular, the final water, oil, and gas recovery can be evaluated by balance equations using final simulation state of the fluid mixture in heterogeneity blocks with bubbled gas partially replacing oil and water in pore space.

The present methodology removes the conceptual difficulties of applying the fluid transport laws in a heterogeneous reservoir. As rock properties vary largely across different regions of the reservoir, the application of the fluid transport laws would require a multitude of different transport models. In one or more embodiments, by describing the transport in terms of chemical component fluxes and chemical potential gradients as driving forces, a single model can be used to evaluate the transport velocity and concentration fluxes across the entire reservoir.

FIGS. 4.1 and 4.2 show flowcharts in accordance with one or more embodiments. While the various blocks in these flowcharts are presented and described sequentially, one of ordinary skill will appreciate that at least some of the blocks may be executed in different orders, may be combined or omitted, and at least some of the blocks may be executed in parallel. Furthermore, the actions in the blocks may be performed actively or passively. For example, some actions may be performed using polling or be interrupt driven in accordance with one or more embodiments. By way of an example, determination blocks may not involve a processor to process an instruction unless an interrupt is received to signify that condition exists in accordance with one or more embodiments. As another example, determination blocks may be performed by performing a test, such as checking a data value to test whether the value is consistent with the tested condition in accordance with one or more embodiments.

FIG. 4.1 shows a general flowchart to obtain the transport matrix from an experimental evaluation.

In Block 411, a set of core samples is obtained for an oilfield like, for example, the field (100) depicted above in FIG. 1. A core sample represents a rock specimen of the subsurface formation that preserves the structure and content of the portion of the subsurface formation from where the core sample was extracted. In one or more embodiments, the core sample may come from a subsurface reservoir. As seen in FIG. 1, a core sample (108-2) is extracted from a wellbore (103) during one or more field operations. For example, the core sample may be obtained by drilling into the portion of the oilfield with a core drill to extract the core sample. The core sample may contain subterranean fluids, such as multiphase compositional fluids.

In Block 413, a set of hydrocarbon samples is obtained for an oilfield like, for example, the field (100) depicted above in FIG. 1. An oil sample represents a volume of oil or gas recovered from a wellsite. As seen in FIG. 1, a hydrocarbon sample (108-4) is extracted to surface at the location of a wellsite (114-2) during one or more field operations.

In Block 415, the core samples and hydrocarbon samples are brought at the reservoir conditions. At depth, a reservoir rock contains some combination of liquid and gaseous hydrocarbons and water, and the reservoir rocks are exposed to certain effective stress and temperature. The fluid distribution at or near the surface is different from that under reservoir conditions. In one or more embodiments, samples analyzed are brought to the real condition at the reservoir location where the core was recovered in order to accurately predict the transport properties of the core samples.

In Block 417, the fluid hydrocarbons are injected into the core samples. In one or more embodiments, the fluid hydrocarbons are applied on the surface of the core at a confining pressure level. Further, an appropriate pressure gradient is adjusted across the core sample and the rate of flow of fluid hydrocarbons through the core sample is observed.

In Block 419, the hydrocarbon transport parameters through core samples are measured. In one of the embodiments, a laboratory test is performed (i.e., applied to the core sample) to obtain measurements (i.e., laboratory test results or simply laboratory results) of the core sample. The measurements are referred to as measured core sample data and correspond to a physical evaluation of the core sample. In one or more embodiments, based on the measured core sample data, it is possible to construct an effective average transport matrix for CPD simulations.

FIG. 4.2 shows a general flowchart to obtain the transport matrix from a computational evaluation.

In Block 421, a set of 2D images of a rock sample are obtained. In one of the embodiments, obtaining 2D porous solid images may be realized by one or more of the following method: X-ray micro-tomography; 3D NMR imaging; 3D reconstruction from petrographic thin-section analysis and confocal microscopy; 3D reconstruction from analysis of 2D element maps acquired by Scanning-Electron Microscopy (SEM); 3D focused ion beam Scanning-Electron Microscopy (FIB-SEM) with possible addition of Energy-dispersive X-ray spectroscopy (EDX) function, X-Ray CT scanning etc.

In Block 423, a 3D digital model of the rock sample is created. In one or more embodiments, spatial distribution of rock grains, pores and solid organics within a formation sample are obtained using the scanning techniques rendering sufficiently high resolution as presented in the previous block. In one or more embodiments the 3D digital model may be obtained by digital processing and morphological analysis of the 3D core images by consecutive application of image filtering, segmentation and multiple property recognition for obtaining a digital 3D model of porous solid samples. At the same time, using a lower resolution scanning technique (e.g., X-ray micro-tomography), heterogeneity information at the larger scale is obtained, as shown in the example image in FIG. 5.2. In one or more embodiments, the heterogeneity distribution within the reservoir is mapped by collecting and studying a sufficient number of the smaller scale samples using images similar to that shown in FIG. 5.1.

In Block 425, a compositional fluid hydrodynamic simulation is performed on the 3D digital model. In one of the embodiments, the simulations can be performed by means of a numerical solver, which is based on a statistical physics many-body problem approach that takes into account specific functional expressions for the entropy or for the Helmholtz energy of the system. In one of the embodiments, the numerical solver can model multiphase compositional hydrodynamics at wide Knudsen number range flow regimes, while taking into account at least one of the following: diffusive and advective transport, disjoining pressure, direct and reverse osmosis effects, thin film precursors and anomalous rheology, contact angle hysteresis due to both roughness and capillary number, adsorption, storage and desorption of solid organic components, and gas drive.

In Block 427, the transport parameters are derived from the simulation results. In one or more embodiments, the storage capacity and transport properties of the 3D digital model are determined. For example, the simulation results may include the recoverable portion of each of the present chemical components constituting fluids in pore space, the recoverable portion of each of the present chemical components constituting solid organics, component exchange between fluids in fore space and solid organics, and dynamic characteristics of the recovery process. In one or more embodiments, based on the simulation results, an effective average transport matrix may be constructed for CPD simulations.

For example, in a three pseudocomponent case in which pseudocomponent 1 stands for heavier hydrocarbons (HCs) in liquid, pseudocomponent 2 stands for lighter HCs in gas, and pseudocomponent 3 stands for HCs in solid organics, the effective average CPD-matrix may be:

$$\overline{\overline{A}} = 2.7 \cdot 10^{-15} \begin{pmatrix} 1 & 0.099 & 0.00035 \\ 0.099 & 4.86 & 5.81 \cdot 10^{-6} \\ 0.00035 & 5.81 \cdot 10^{-6} & 0.0104 \end{pmatrix} \left[ \frac{\text{kmol}^2 \cdot s}{\text{kg} \cdot m^3} \right] \qquad \text{EQ. 2}$$

The diagonal part of this matrix characterizes transport properties of each of the pseudocomponents, while the off-diagonal coefficients characterize mutual transfer properties between HCs in different pseudocomponents.

FIGS. 5.1, 5.2, 6.1, 6.2, 7, 8.1, 8.2, 9.1, and 9.2 show examples in accordance with one or more embodiments. The examples are not intended to limit embodiments described herein.

FIG. 5.1 shows a high-resolution 2D image used to derive the 3D digital model. In one or more embodiments, the spatial distribution of rock grains (511), pores (513) and solid organics (515) is presented in the two-dimensional image obtained by FIB-SEM.

FIG. 5.2 shows a low resolution 2D image used to define the heterogeneity blocks of the larger scale heterogeneous model. In one or more embodiments, the lower resolution image shows heterogeneity features such as clusters with predominance of solid grains (521), clusters with predominance of pores (523), and clusters with predominance of solid organics (525). In one or more embodiments, the information obtained in the numerical simulation on a representative set of high resolution digital models like one presented in FIG. 5.1, is combined to obtain the distribution of transport matrices to initialize CPD simulation on a larger scale heterogeneous model.

FIG. 6.1 shows a digital rendering of a high resolution 3D digital model. In one or more embodiments, the high resolution 3D digital model distribution of both pores (613) and solid organics (615) is shown in display a; in display b pore space (613) is presented; and in display c) solid organics (615) is presented. Rock grains (611) are made transparent in the three displays.

FIG. 6.2 shows a digital rendering of a high resolution 3D digital model in two comparative stages of the simulation. In one or more embodiments, the 3D distribution of hydrocarbon components in liquid phase (625), in free gas phase (627), and in solid organics (623) are shown. In one or more embodiments, the hydrocarbon components are shown before production simulation in display a) and after production simulation in display b). As seen in FIG. 6.2, the free gas phase (627) is only present after the production simulation. The reason for this is related to the pressure drop during production evolution.

Figure 7:
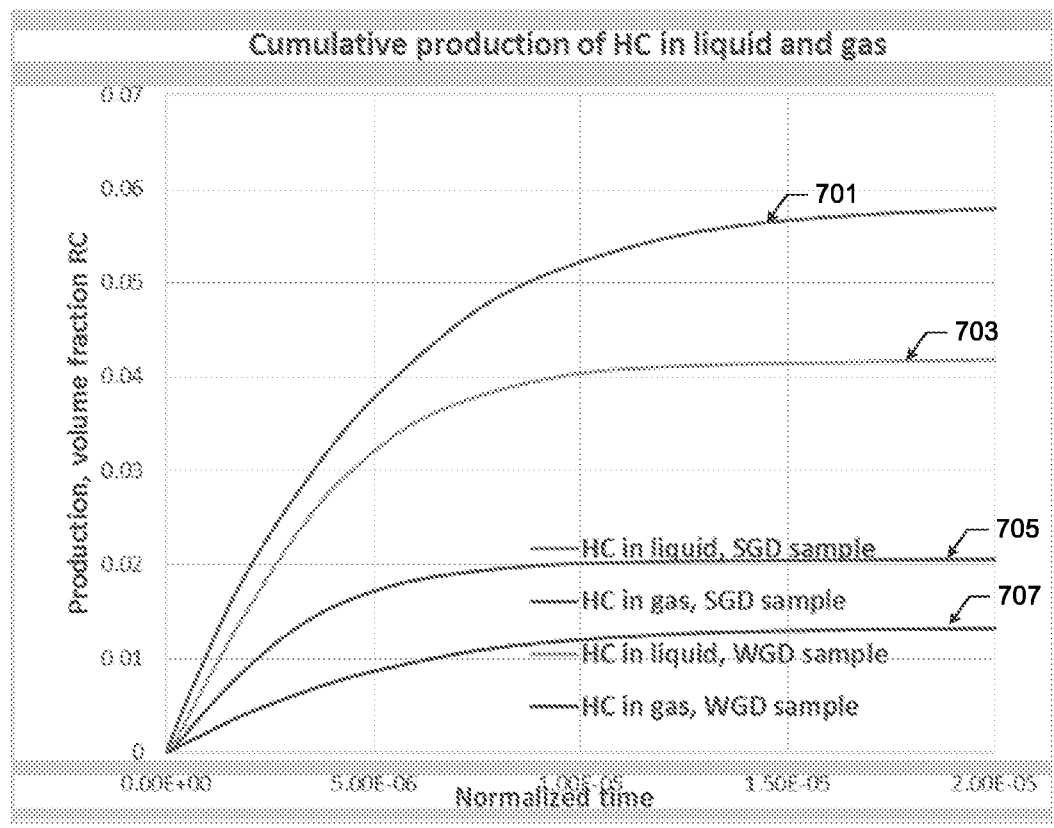

FIG. 7 shows a graph of the production dynamics during a 3D digital model simulation of two scenarios. In one or more embodiments, the production evolution and recovery volumes estimates for two 3D digital models corresponding to samples exhibiting strong gas drive (SGD) and for samples exhibiting weak gas drive (WGD). In one or more embodiments, the drive mechanism of the hydrocarbons (HC) production refers to the natural energy of a reservoir that is used to move oil and gas toward the wellbore. For the liquid phase, the initially dissolved gas components appear in a form of a free gas phase as the reservoir pressure drops during production, and the accumulation and expansion of the gas provides most of the reservoir's drive energy. For the free gas phase, the primary source of drive energy is the expansion of the free gas as the reservoir pressure drops. As seen in FIG. 7, HC production rates from the liquid phase are higher than the HC production rates from the free gas phase due to the tendency of expanding gas to become trapped in the pores. In one or more embodiments, the rate of HC production is closely tied to the relative size of the appeared free gas volume (i.e., with larger fraction of the initially dissolved gas), with samples having a larger free gas volume resulting in a stronger gas drive mechanism. As seen in FIG. 7, HC production rates from SGD sample are relatively higher than the HC production rates from WGD sample as a more gas volume expand in the sample having the largest free gas volume.

FIGS. 8.1 and 8.2 shows an embodiment of the multiscale reservoir modeling and production simulation using chemical potential drive technology. In one or more embodiment, the distribution of the components in each phase that includes hydrocarbon in liquid, gas and solid organics before production simulation (801) is presented before and after production simulation (805). In one or more embodiments, the mobile hydrocarbon reserves before production simulation (803) and after production simulation (807). Distributions are shown in lower resolution larger scale digital model in several two-dimensional cross-sections (810).

Embodiments may be implemented on a computing system. Any combination of mobile, desktop, server, router, switch, embedded device, or other types of hardware may be used. For example, as shown in FIG. 9.1, the computing system (900) may include one or more computer processors (902), non-persistent storage (904) (e.g., volatile memory, such as random access memory (RAM), cache memory), persistent storage (906) (e.g., a hard disk, an optical drive such as a compact disk (CD) drive or digital versatile disk (DVD) drive, a flash memory, etc.), a communication interface (912) (e.g., Bluetooth interface, infrared interface, network interface, optical interface, etc.), and numerous other elements and functionalities.

The computer processor(s) (902) may be an integrated circuit for processing instructions. For example, the computer processor(s) may be one or more cores or micro-cores of a processor. The computing system (900) may also include one or more input devices (910), such as a touchscreen, keyboard, mouse, microphone, touchpad, electronic pen, or any other type of input device.

The communication interface (912) may include an integrated circuit for connecting the computing system (900) to a network (not shown) (e.g., a local area network (LAN), a wide area network (WAN) such as the Internet, mobile network, or any other type of network) and/or to another device, such as another computing device.

Further, the computing system (900) may include one or more output devices (908), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (902), non-persistent storage (904), and persistent storage (906). Many different types of computing systems exist, and the aforementioned input and output device(s) may take other forms.

Software instructions in the form of computer readable program code to perform embodiments may be stored, in whole or in part, temporarily or permanently, on a non-transitory computer readable medium such as a CD, DVD, storage device, a diskette, a tape, flash memory, physical memory, or any other computer readable storage medium. Specifically, the software instructions may correspond to computer readable program code that, when executed by a processor(s), is configured to perform one or more embodiments.

The computing system (900) in FIG. 9.1 may be connected to or be a part of a network. For example, as shown in FIG. 9.2, the network (920) may include multiple nodes (e.g., node X (922), node Y (924)). Each node may correspond to a computing system, such as the computing system shown in FIG. 9.1, or a group of nodes combined may correspond to the computing system shown in FIG. 9.1. By way of an example, embodiments may be implemented on a node of a distributed system that is connected to other nodes. By way of another example, embodiments may be implemented on a distributed computing system having multiple nodes, where each portion may be located on a different node within the distributed computing system. Further, one or more elements of the aforementioned computing system (900) may be located at a remote location and connected to the other elements over a network.

Although not shown in FIG. 9.2, the node may correspond to a blade in a server chassis that is connected to other nodes via a backplane. By way of another example, the node may correspond to a server in a data center. By way of another example, the node may correspond to a computer processor or micro-core of a computer processor with shared memory and/or resources.

The nodes (e.g., node X (922), node Y (924)) in the network (920) may be configured to provide services for a client device (926). For example, the nodes may be part of a cloud computing system. The nodes may include functionality to receive requests from the client device (926) and transmit responses to the client device (926). The client device (926) may be a computing system, such as the computing system shown in FIG. 9.1. Further, the client device (926) may include and/or perform at least a portion of one or more embodiments.

The computing system or group of computing systems described in FIGS. 9.1 and 9.2 may include functionality to perform a variety of operations disclosed herein. For example, the computing system(s) may perform communication between processes on the same or different system. A variety of mechanisms, employing some form of active or passive communication, may facilitate the exchange of data between processes on the same device. Examples representative of these inter-process communications include, but are not limited to, the implementation of a file, a signal, a socket, a message queue, a pipeline, a semaphore, shared memory, message passing, and a memory-mapped file. Further details pertaining to a couple of these non-limiting examples are provided below.

Based on the client-server networking model, sockets may serve as interfaces or communication channel endpoints enabling bidirectional data transfer between processes on the same device. Foremost, following the client-server networking model, a server process (e.g., a process that provides data) may create a first socket object. Next, the server process binds the first socket object, thereby associating the first socket object with a unique name and/or address. After creating and binding the first socket object, the server process then waits and listens for incoming connection requests from one or more client processes (e.g., processes that seek data). At this point, when a client process wishes to obtain data from a server process, the client process starts by creating a second socket object. The client process then proceeds to generate a connection request that includes at least the second socket object and the unique name and/or address associated with the first socket object. The client process then transmits the connection request to the server process. Depending on availability, the server process may accept the connection request, establishing a communication channel with the client process, or the server process, busy in handling other operations, may queue the connection request in a buffer until server process is ready. An established connection informs the client process that communications may commence. In response, the client process may generate a data request specifying the data that the client process wishes to obtain. The data request is subsequently transmitted to the server process. Upon receiving the data request, the server process analyzes the request and gathers the requested data. Finally, the server process then generates a reply including at least the requested data and transmits the reply to the client process. The data may be transferred, more commonly, as datagrams or a stream of characters (e.g., bytes).

Shared memory refers to the allocation of virtual memory space in order to substantiate a mechanism for which data may be communicated and/or accessed by multiple processes. In implementing shared memory, an initializing process first creates a shareable segment in persistent or non-persistent storage. Post creation, the initializing process then mounts the shareable segment, subsequently mapping the shareable segment into the address space associated with the initializing process. Following the mounting, the initializing process proceeds to identify and grant access permission to one or more authorized processes that may also write and read data to and from the shareable segment. Changes made to the data in the shareable segment by one process may immediately affect other processes, which are also linked to the shareable segment. Further, when one of the authorized processes accesses the shareable segment, the shareable segment maps to the address space of that authorized process. Often, one authorized process may mount the shareable segment, other than the initializing process, at any given time.

Other techniques may be used to share data, such as the various data described in the present application, between processes without departing from the scope. The processes may be part of the same or different application and may execute on the same or different computing system.

Rather than or in addition to sharing data between processes, the computing system performing one or more embodiments may include functionality to receive data from a user. For example, in one or more embodiments, a user may submit data via a GUI on the user device. Data may be submitted via the GUI by a user selecting one or more GUI widgets or inserting text and other data into GUI widgets using a touchpad, a keyboard, a mouse, or any other input device. In response to selecting a particular item, information regarding the particular item may be obtained from persistent or non-persistent storage by the computer processor. Upon selection of the item by the user, the contents of the obtained data regarding the particular item may be displayed on the user device in response to the user's selection.

By way of another example, a request to obtain data regarding the particular item may be sent to a server operatively connected to the user device through a network. For example, the user may select a uniform resource locator (URL) link within a web client of the user device, thereby initiating a Hypertext Transfer Protocol (HTTP) or other protocol request being sent to the network host associated with the URL. In response to the request, the server may extract the data regarding the particular selected item and send the data to the device that initiated the request. Once the user device has received the data regarding the particular item, the contents of the received data regarding the particular item may be displayed on the user device in response to the user's selection. Further to the above example, the data received from the server after selecting the URL link may provide a web page in Hyper Text Markup Language (HTML) that may be rendered by the web client and displayed on the user device.

Once data is obtained, such as by using techniques described above or from storage, the computing system, in performing one or more embodiments, may extract one or more data items from the obtained data. For example, the extraction may be performed as follows by the computing system in FIG. 9.1. First, the organizing pattern (e.g., grammar, schema, layout) of the data is determined, which may be based on one or more of the following: position (e.g., bit or column position, Nth token in a data stream, etc.), attribute (where the attribute is associated with one or more values), or a hierarchical/tree structure (consisting of layers of nodes at different levels of detail-such as in nested packet headers or nested document sections). Then, the raw, unprocessed stream of data symbols is parsed, in the context of the organizing pattern, into a stream (or layered structure) of tokens (where each token may have an associated token "type").

Next, extraction criteria are used to extract one or more data items from the token stream or structure, where the extraction criteria are processed according to the organizing pattern to extract one or more tokens (or nodes from a layered structure). For position-based data, the token(s) at the position(s) identified by the extraction criteria are extracted. For attribute/value-based data, the token(s) and/or node(s) associated with the attribute(s) satisfying the extraction criteria are extracted. For hierarchical/layered data, the token(s) associated with the node(s) matching the extraction criteria are extracted. The extraction criteria may be as simple as an identifier string or may be a query presented to a structured data repository (where the data repository may be organized according to a database schema or data format, such as XML).

The extracted data may be used for further processing by the computing system. For example, the computing system of FIG. 9.1, while performing one or more embodiments, may perform data comparison. Data comparison may be used to compare two or more data values (e.g., A, B). For example, one or more embodiments may determine whether A>B, A=B, A!=B, A<B, etc. The comparison may be performed by submitting A, B, and an opcode specifying an operation related to the comparison into an arithmetic logic unit (ALU) (i.e., circuitry that performs arithmetic and/or bitwise logical operations on the two data values). The ALU outputs the numerical result of the operation and/or one or more status flags related to the numerical result. For example, the status flags may indicate whether the numerical result is a positive number, a negative number, zero, etc. By selecting the proper opcode and then reading the numerical results and/or status flags, the comparison may be executed. For example, in order to determine if A>B, B may be subtracted from A (i.e., A−B), and the status flags may be read to determine if the result is positive (i.e., if A>B, then A−B>0). In one or more embodiments, B may be considered a threshold, and A is deemed to satisfy the threshold if A=B or if A>B, as determined using the ALU. In one or more embodiments, A and B may be vectors, and comparing A with B includes comparing the first element of vector A with the first element of vector B, the second element of vector A with the second element of vector B, etc. In one or more embodiments, if A and B are strings, the binary values of the strings may be compared.

The computing system in FIG. 9.1 may implement and/or be connected to a data repository. For example, one type of data repository is a database. A database is a collection of information configured for ease of data retrieval, modification, re-organization, and deletion. Database Management System (DBMS) is a software application that provides an interface for users to define, create, query, update, or administer databases.

The user, or software application, may submit a statement or query into the DBMS. Then the DBMS interprets the statement. The statement may be a select statement to request information, update statement, create statement, delete statement, etc. Moreover, the statement may include parameters that specify data, or data container (database, table, record, column, view, etc.), identifier(s), conditions (comparison operators), functions (e.g. join, full join, count, average, etc.), sort (e.g. ascending, descending), or others. The DBMS may execute the statement. For example, the DBMS may access a memory buffer, a reference or index a file for read, write, deletion, or any combination thereof, for responding to the statement. The DBMS may load the data from persistent or non-persistent storage and perform computations to respond to the query. The DBMS may return the result(s) to the user or software application.

The computing system of FIG. 9.1 may include functionality to present raw and/or processed data, such as results of comparisons and other processing. For example, presenting data may be accomplished through various presenting methods. Specifically, data may be presented through a user interface provided by a computing device. The user interface may include a GUI that displays information on a display device, such as a computer monitor or a touchscreen on a handheld computer device. The GUI may include various GUI widgets that organize what data is shown as well as how data is presented to a user. Furthermore, the GUI may present data directly to the user, e.g., data presented as actual data values through text, or rendered by the computing device into a visual representation of the data, such as through visualizing a data model.

For example, a GUI may first obtain a notification from a software application requesting that a particular data object be presented within the GUI. Next, the GUI may determine a data object type associated with the particular data object, e.g., by obtaining data from a data attribute within the data object that identifies the data object type. Then, the GUI may determine any rules designated for displaying that data object type, e.g., rules specified by a software framework for a data object class or according to any local parameters defined by the GUI for presenting that data object type. Finally, the GUI may obtain data values from the particular data object and render a visual representation of the data values within a display device according to the designated rules for that data object type.

Data may also be presented through various audio methods. In particular, data may be rendered into an audio format and presented as sound through one or more speakers operably connected to a computing device.

Data may also be presented to a user through haptic methods. For example, haptic methods may include vibrations or other physical signals generated by the computing system. For example, data may be presented to a user using a vibration generated by a handheld computer device with a predefined duration and intensity of the vibration to communicate the data.

The above description of functions present a few examples of functions performed by the computing system of FIG. 9.1 and the nodes and/or client device in FIG. 9.2. Other functions may be performed using one or more embodiments.

Although the preceding description has been described herein with reference to particular means, materials, and embodiments, it is not intended to be limited to the particular disclosed herein. By way of further example, embodiments may be utilized in conjunction with a handheld system (i.e., a phone, wrist or forearm mounted computer, tablet, or other handheld device), portable system (i.e., a laptop or portable computing system), a fixed computing system (i.e., a desktop, server, cluster, or high performance computing system), or across a network (i.e., a cloud-based system). As such, embodiments extend to all functionally equivalent structures, methods, uses, program products, and compositions as are within the scope of the appended claims.

While a limited number of embodiments are described, those skilled in the art, having benefit of this disclosure, will appreciate that other embodiments can be devised which do not depart from the scope as disclosed herein. Accordingly, the scope should be limited by the attached claims.

What is claimed is:

1. A method for evaluation of recoverable volumes of hydrocarbons from a heterogeneous reservoir comprising:
dividing the reservoir into a hierarchy comprising a plurality of heterogeneity blocks, the plurality of heterogeneity blocks comprising a plurality of superior heterogeneity blocks comprising a plurality of inferior heterogeneity blocks, wherein each of the plurality of heterogeneity blocks is characterized by a transport matrix that defines a hydraulic transport property of each heterogeneity block;
calculating, based on the hierarchy, a first set of values for the transport matrices of the plurality of superior heterogeneity blocks using a second set of values for the transport matrices of the plurality of inferior heterogeneity blocks;
obtaining, by evaluating a fluid transport law, a third set of values for the transport matrix of a plurality of foundation blocks, the plurality of foundation blocks being in a lowest rank of the hierarchy; and
performing, based on the first set of values, the second set of values, and the third set of values, a simulation of hydrocarbons flow in the heterogeneous reservoir to obtain a simulation result.

2. The method of claim 1, further comprising:
obtaining a set of recoverable volumes of hydrocarbons in the reservoir based on the simulation result.

3. The method of claim 2, further comprising:
performing a field operation based on the set of recoverable volumes of hydrocarbons.

4. The method of claim 1, wherein the hydraulic transport property of a subset of the plurality of inferior heterogeneity blocks span the variability of the hydraulic transport property of a superior heterogeneity block within the plurality of superior heterogeneity blocks ranked immediately above the subset of the plurality of inferior heterogeneity blocks.

5. The method of claim 1, wherein the evaluation of the fluid transport law in the foundation blocks is obtained based on at least one method selected from a group consisting of experimental and computational methods.

6. The method of claim 5, wherein the experimental method comprises:
injecting fluid hydrocarbons into a set of core samples according to a laboratory test procedure, wherein the set of core samples corresponds to the location of the foundation blocks; and
obtaining measurements of the injected fluid flow through the set of core samples.

7. The method of claim 5, wherein the experimental method comprises:
producing fluid hydrocarbons from a set of core samples according to a laboratory test procedure, wherein the set of core samples corresponds to the location of the foundation blocks; and
obtaining measurements of the produced fluid flow from the set of core samples.

8. The method of claim 5, wherein the computational method comprises:
obtaining two-dimensional (2D) porous solid images of the internal structure of the foundation blocks;
build, based on the 2D porous solid images, a high resolution 3D digital model of the foundation blocks; and
perform compositional fluid hydrodynamic simulations of fluid hydrocarbons transport within the foundation blocks using a solver for fluid transport law with applied boundary conditions.

9. The method of claim 5, wherein the 3D digital model is obtained by digital processing and morphological analysis of the 3D core images.

10. The method of claim 1, wherein the heterogeneity blocks are defined based on a threshold value for the variation of a property of the heterogeneous reservoir rock.

11. The method of claim 9, wherein the variation of a property of the heterogeneous reservoir rock is determined based on a lower resolution scanning technique.

12. The method of claim 1 further includes mapping a set of fluid transport connectivity relationships between the heterogeneity blocks.

13. The method of claim 1, wherein the simulation of hydrocarbons flow is based on determining the chemical potential within each heterogeneity block.

14. A method for evaluation of recoverable volumes of hydrocarbons from a heterogeneous reservoir comprising:
dividing the reservoir into a plurality of foundation blocks, wherein each of the plurality of foundation blocks is characterized by a transport matrix that defines a hydraulic transport property of the foundation block;
obtaining a two-dimensional (2D) porous solid image of an internal structure of a plurality of foundation blocks;
build, based on the 2D porous solid image, a three-dimensional (3D) digital model of the plurality of foundation blocks; and
perform a compositional fluid hydrodynamic simulation of fluid hydrocarbons transport within the plurality of foundation blocks using a solver for a fluid transport law with applied boundary conditions, wherein the compositional fluid hydrodynamic simulation is derived from chemical potential drive.

15. A system for evaluation of recoverable volumes of hydrocarbons from a heterogeneous reservoir comprising:
a computer processor; and
memory comprising instructions, that when executed by the computer processor cause the computer processor to:

divide the reservoir into a hierarchy comprising a plurality of heterogeneity blocks, the plurality of heterogeneity blocks comprising a plurality of superior heterogeneity blocks comprising a plurality of inferior heterogeneity blocks, wherein each of the plurality of heterogeneity blocks is each characterized by a transport matrix that defines a hydraulic transport property of each heterogeneity block;

calculate, based on the hierarchy, a first set of values for the transport matrices of the plurality of superior heterogeneity blocks using a second set of values for the transport matrices of the plurality of inferior heterogeneity blocks;

obtain, by evaluating a fluid transport law, a third set of values for the transport matrix of a plurality of foundation blocks, the plurality of foundation blocks being in a lowest rank of the hierarchy; and perform, based on the first set of values, the second set of values, and the third set of values, a simulation of hydrocarbons flow in the heterogeneous reservoir to obtain a simulation result.

16. A computer program product comprising a non-transitory computer-readable medium having computer readable program code embodied therein executable by a processor to perform the method according to claim 1.

\* \* \* \* \*